United States Patent [19]

Rogers et al.

[11] Patent Number: 5,064,269

[45] Date of Patent: Nov. 12, 1991

[54] LIGHT COLLECTION METHOD AND APPARATUS

[75] Inventors: Edward G. Rogers, Mountain View; Herbert E. Litvak, Palo Alto, both of Calif.

[73] Assignee: Xinix, Inc., Santa Clara, Calif.

[21] Appl. No.: 525,467

[22] Filed: May 18, 1990

[51] Int. Cl.$^5$ .............................................. G02B 6/04
[52] U.S. Cl. ...................................... 385/115; 385/33
[58] Field of Search .......................... 350/96.18, 96.24

[56] References Cited

U.S. PATENT DOCUMENTS 4,974,927 12/1990 Kimura .............................. 350/96.18

Primary Examiner—William L. Sikes
Assistant Examiner—Robert E. Wise
Attorney, Agent, or Firm—William Green & Associates

[57] ABSTRACT

The device of this invention employs a short focal length anamorphic lens to collect light from a source with asymmetric angular dispersion of the flux. Focal lengths are chosen to provide an approximate line fuzzy focus with a f/number equal to or smaller than one of the associated detector. Fiber optic cable systems are used to deliver the condensed light and the diameter of the optical fibers is chosen to give a numerical aperture greater than that of the detector. The number of optical fibers in the cable should be large enough to over-fill the limiting area of the etendue of the detector. In a preferrred embodiment the fiberoptic cable is bifurcated and fibers from the separate channels are interleaved.

5 Claims, 3 Drawing Sheets

LIGHT COLLECTION METHOD AND APPARATUS

BACKGROUND OF THE INVENTION

1. Field of the Invention

This invention relates generally to the use of optical devices to sense the progress of processes, transmit signals related to such progress, detect such signals and extract from such signals information to control such processes. More particularly, this invention relates to an improved light collection system for use in optical emission spectroscopy devices designed to monitor, diagnose, and control processing and to determine endpoints in either photolithographic wet or dry etching processes or thin film processes for the fabrication of semiconductor devices.

2. Brief Description of the Prior Art

Photolithography makes it possible to transfer a desired circuit pattern to a surface of a semiconductor device. In a simplified photolithograpic process a silicon or gallium arsenide wafer or other substrate with a suitable substrate coating such as silicon dioxide, polysilicon, or aluminum or other metal is coated with a photoresist film and then subjected to an imaging and developing process which exposes regions of the substrate coating in a pattern defined by a mask having opaque and transparent portions positioned to form the desired pattern. The wafer is then etched by a subsequent process in the pattern formed by the developing process.

During the etching steps of the process it is important to monitor the progress of the etch and to detect the point at which the material or film which underlies the layer being etched is reached. Optical emission endpoint spectroscopy is currently used to monitor and detect process endpoint in plasma etching systems. This is possible because the plasma excites certain molecular species and causes them to emit light of wavelengths that are characteristic of each species. In an optical monitoring system specific wavelengths of the light emitted from the plasma are selected and fed to detectors, such as photo diodes, photo multipliers, and array detectors. It is known that the intensity of the signals is proportional to the level of light detected and by selecting wavelengths which correlate exclusively to either the reactants or the reaction products of the particular process, the process may be monitored. In particular, by selecting a wavelength which corresponds to the product of reactants from the process gas and the layer being etched, the point at which the next layer is reached may be easily detected by a decrease in measured emissions from the selected product. On the otherhand, by selecting a wavelength which corresponds to the reactants, the point at which the reactants are no longer being consumed is indicated by a change or stabilization in measured emissions from the reactants. When the film being etched has completely cleared from the underlying material or film there is a chemical change both in the gas phase and n the film. Product species from the film are no longer being generated, and some reactants increase because they are no longer being consumed by the reaction. These chemical changes show up as changes in optical emission intensities. Thus by continuously monitoring the intensity of an appropriate emission wavelength, either a reactant or product of the etch reaction, a change in emission intensity generally signals removal of the film being etched and contact of the etching agent with the underlying material or film. Although it is not uncommon to allow the reaction to proceed for an additional period of time, the point at which the underlying material or film is contacted is commonly known as endpoint.

In certain types of applications, including but not limited to plasma etching of semiconductor wafers, ion milling of surfaces, plasma diagnosis, and plasma deposition, where the light is emitted from an extended, diffuse anisotropic source and must be transmitted to a remote detector, it is necessary to collect as much light as possible. at the desired wavelengths to provide a sufficient signal to noise ratio for meaningful monitoring. The trend toward increased miniaturization of features causes the continued reduction of critical dimensions which in turn results in smaller area being reacted and thus less material producing emissions. This also makes it necessary to collect as much of the limited light as possible.

For purposes of this discussion an extended source is defined as a three dimensional source having a depth of the order of magnitude approximately equal to or greater than the distance between the source and the observation point. Diffuse light is defined as uncollimated light.

In a typical prior art system light would be transmitted from a chamber etch window to a detector by direct coupling of the detector to the window, by remotely coupling the detector to the window using a fiberoptic system without a focusing lens, or by remotely coupling the detector the window using a fiberoptic system with a spherical focusing lens. In many cases where the intensity of the light emission at the selected wavelengths is low, none of the above approaches collected sufficient light to optimally operate the endpoint controller with an extended diffuse anisotropic light source. To increase the light collection and delivery to the detector from such a source requires a system designed to adapt the inherent lower symmetry of the angular dispersion of light by this non-Lambertian source to collect light at the limiting etendue of the detector. Furthermore, it was determined that for certain processes multiple signals are desirable, and prior art approaches were so inadequate that endpoint detection was not deemed to be of practical value. Through experimentation it was determined that where the light source is asymmetric the light collection could be substantially improved by providing an anamorphic lens, which in effect matches the etendue of the source with the etendue of the detector.

The principal object of this invention is a device to collect light from extended diffuse anisotropic sources, such as plasma etchers, plasma deposition chambers, furnaces and similar sources and to deliver such light to a detector.

Another object of this invention is a device to condense a diffuse non-Lambertian light signal and provide a uniform distribution of intensity in the resulting pattern.

Yet another object of this invention is a device to provide the efficient transfer of light from a three dimensional, non-collimated source having an inherent fuzzy image to a detector.

SUMMARY OF THE INVENTION

The device of this invention employs a short focal length anamorphic lens to collect light from a source with asymmetric angular dispersion of the flux. Focal lengths are chosen to provide an approximate line fuzzy focus with a f/number equal to or smaller than that of the associated detector. Fiber optic cable systems are used to deliver the condensed light and the diameter of the optical fibers is chosen to give a numerical aperture greater than that of the detector. The number of optical fibers in the bundle should be large enough to over-fill the limiting area of the etendue of the detector.

An important aspect of this invention is the recognition that in the collection of light from extended diffuse anisotropic sources the inherent symmetry of the angular dispersion of the source prevents collection from the source at the limiting etendue of the detector by use of spherical optics. Since the signal will only be measured by the detector if it falls within the input area and solid acceptance angle of the detector, for maximum throughput and detection of the signal, it must be delivered to the detector within these bounds. The signal can be collected from different bounds for the individual variables, area and angle, but the product of the detector acceptance area and angle is a constant which defines the maximum "etendue" for collection and transmission of light to the system. Accordingly, optimum collection, transmission, and detection will occur when there is maximum possible overlap in the radiance of the source as a function of position on a surface and angle of observation with the etendue of the detector.

If the source angular or linear extent of emission in one or both of two dimensions is less than the angular or linear extent of acceptance of the detector, the collected signal transmitted to the detector should be adjusted in either angular or linear extent to match that of the detector. To accomplish this the etendue of the collection and transmission system should be at least equal to the etendue of the detector input.

If the angular output of the source is less than the acceptance of the detector in at least one dimension, then the detector will not be filled and will not function at an optimal level. The improvement of this invention is based upon providing more light to the detector by increasing the source output angle through collecting light with an anamorphic lens from an extended volume within the source, in combination with a fiber optic cable system to deliver the light with matching etendue to the detector.

If the source is anisotropic in emission angle measured with respect to the normal for the collection optics and is extended, no imaging is possible in a single plane. To maximize the collection of light and delivery to the detector, requires an anamorphic lens system to condense the signal with a uniform distribution of intensity in the resulting pattern. The resulting pattern will be fuzzy to the extent that the source is diffuse and not collimated.

In the practice of this invention, the amount of light transmitted from the focusing lens to the limited aperture of the detector is increased by sizing and arranging a fiber optic bundle so that the light at the focus of the lens overfills the fiber bundle ends if the minimum focus area is larger than the detector aperture. It follows that the cross-sectional area of the fiber optic bundle should be greater than or equal to the area of the aperture.

The etendue of the detector limits the effective collection of light from the source to the same value. However, there are two variables in this constant product: area and limiting solid acceptance angle. In the case of a source in which the limiting solid angle of emission is less than that of the detector, a lens system is provided to collect from an extended area and translate that area into an angle which matches or exceeds the limiting solid acceptance angle. In practice the emission is not defined by a limiting angle as much as by a radiant flux density vs. angle, with maximum flux at 0 degrees with respect to the axis of the extended source. If the source is narrow with respect to the depth, then the radiant flux density may peak sharply as a function of angle about 0 degrees. In this case, a lens which refracts the light in the dimension in which the source is narrow will increase the radiant flux density integrated over the total acceptance angle of the detector.

Since the source as taught in this invention is not in a plane, the lens system cannot create a sharp image, but will have some inherent fussiness. The dimension of this fussiness will determine the coupling to the fiber optics required to transmit the signal to the detector. The most effective transfer occurs when the fiber size is larger than the effective fuzzy image created by the lens. In such a case effectively all of the light will be brought to the slits of the detector. Since the fiber size is not uniquely determined by the need to fill the slits with fibers, the choice of the fiber size is dictated by the size of the fuzzy image.

DETAILED DESCRIPTION OF THE INVENTION

Figure 1:
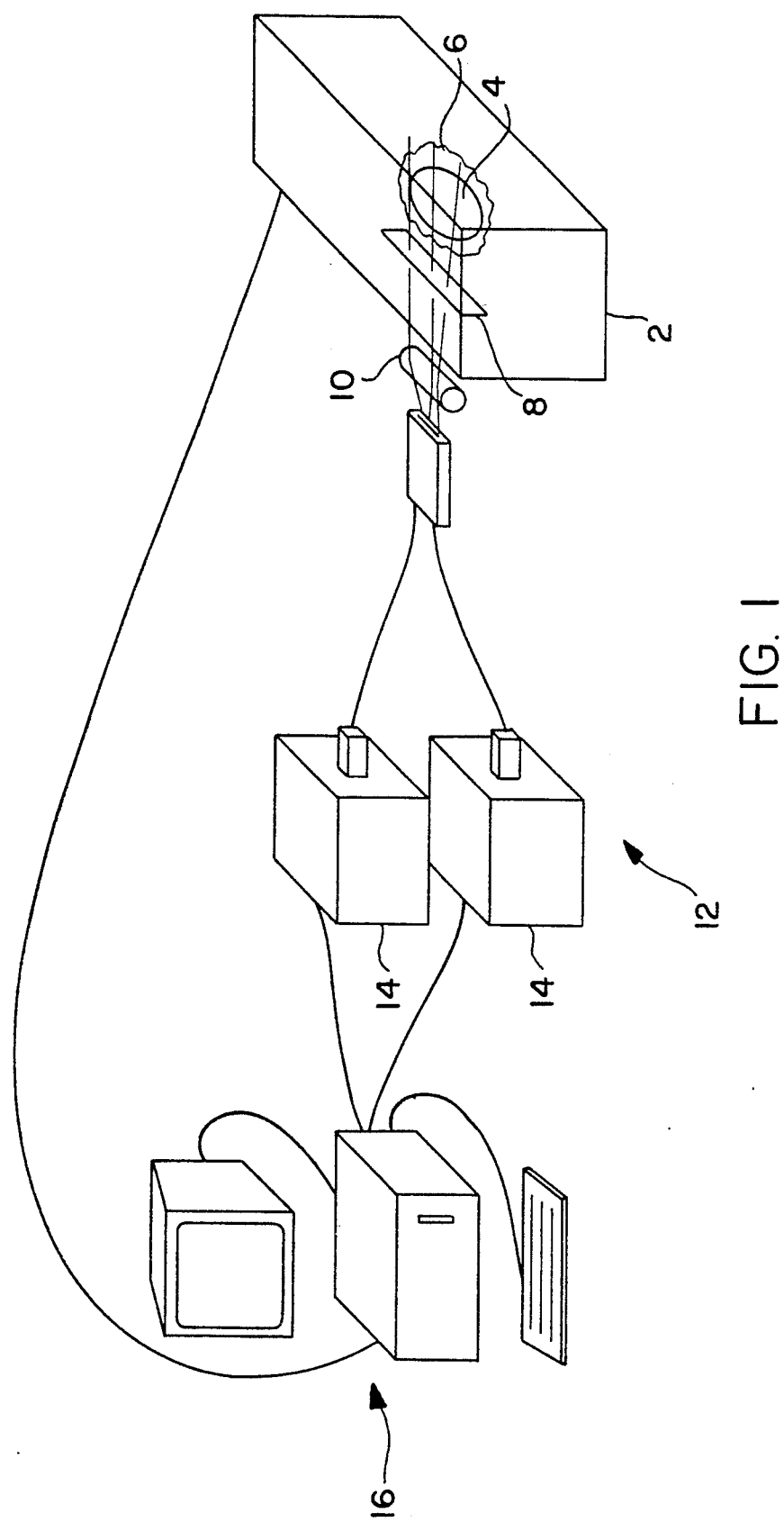
FIG. 1 shows in schematic form, an example of an optical emission system in accordance with the invention.

FIG. 1 shows a wafer processing plasma chamber 2 containing a wafer 4 which is exposed to a reactive gas mixture, plasma 6. Positioned within a wall of chamber 2 is a quartz window 8, through which the process taking place within chamber 2 may be observed. A focusing lens 10 is positioned to collect light from chamber 2 through window 8 and is coupled to a bifurcated fiberoptic probe 12 which transmits the collected light to detectors 14, which may be autoscan or manual monochromators. Detectors 14 then convert selected wavelengths of the light to electrical signals which are then passed to an endpoint controller 16, such as a Xinix 1200 Endpoint Control Unit, which uses various parameters and algorithms to display and detect endpoint. The controller 16 is linked to chamber 2 through an RS232 port or logic I/O interfaces, and may be used to remotely start the etching process and to shut off the etcher or advance it to the next process step upon detection endpoint.

Figure 2:
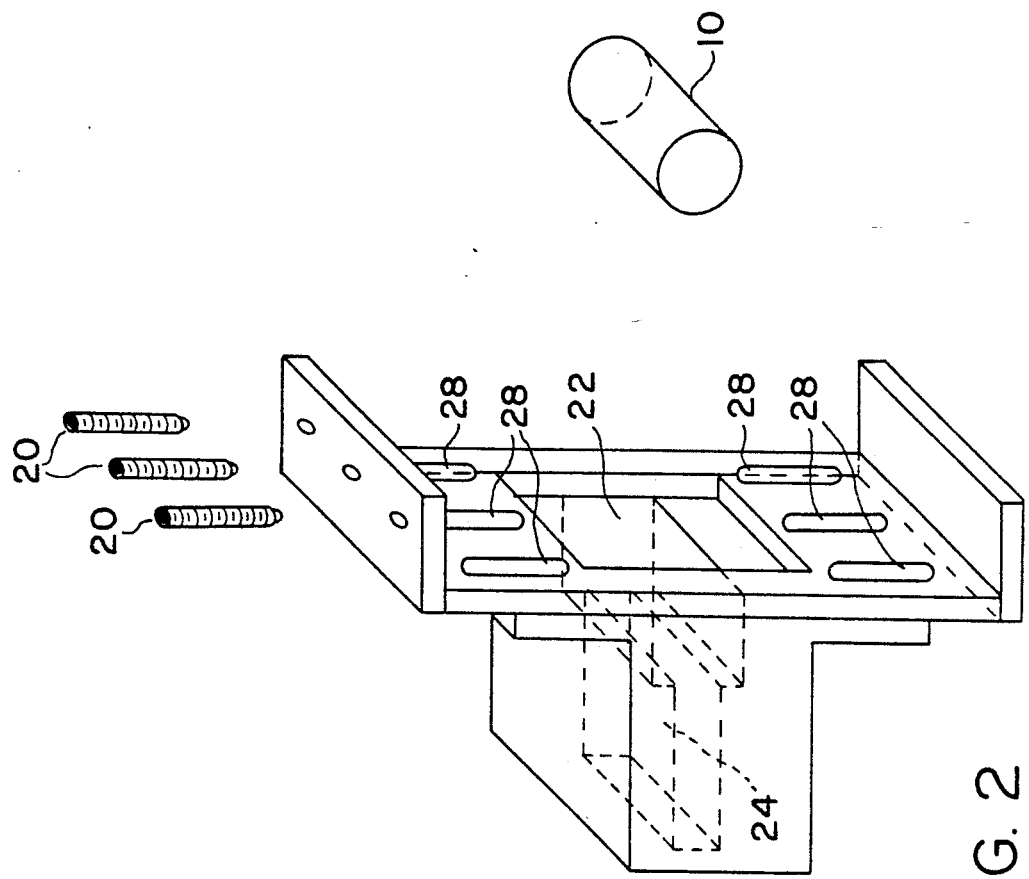
FIG. 2 shows in detail the lens, a fiber optic terminus and a mechanical connecting and focusing assembly.
Figure 2:
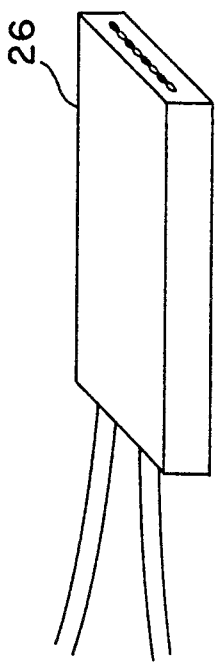

In FIG. 2, a mechanical and focusing assembly generally designated as 18, is shown. Assembly 18, is adapted to clamp upon the port of window 8 and be affixed thereto by screws 20. Assembly 18 has an opening which is sized and shaped to mate with window 8 and contains lens cavity 22 for holding lens 8 and cable cavity 24 for receiving the terminus of fiberoptic cable 12.

The portion of assembly 18 which contains cavities 22 and 24 is adjustable vertically by fasteners (not shown) which are mounted through vertical slots 28 which allow vertical movement of the fasteners. This vertical movement provides for focusing of the lens and fiberoptic cables.

Figure 3:
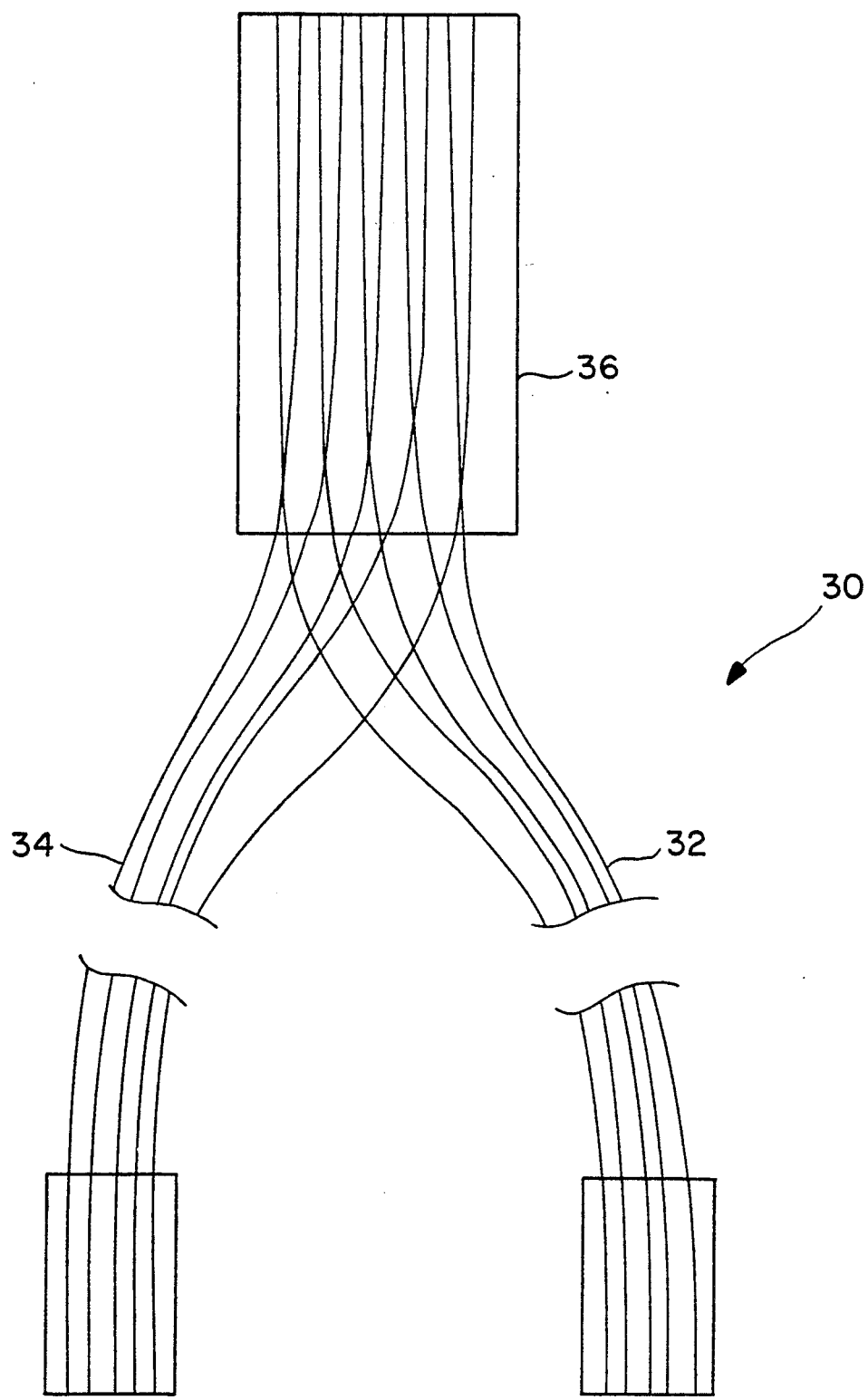
FIG. 3 shows an interleaved bifurcated fiberoptic cable 26.

In FIG. 3, an expanded view of a bifurcated optic cable is shown generally at 30. The cable has fibers 32 in one channel and fibers 34 in the other. After the fibers enter the terminus 36 of the cable they are mixed to provide interleaving of the fibers from the two channels. The interleaving, as stated above assures that both channels are looking at the same thing and minimizes the errors attributable to sampling from different sources.

The invention as described overcomes the light deficiencies of the prior art and enhances the ability to use bifurcated cable to provide separate signals of sufficient strength for two detectors, from a single otherwise deficient light source.

Light may be collected in the emission spectrum from the ultra violet to the near infrared.

Variations of the device will be obvious to those skilled in the art. The lens material may be selected to allow optimal transmission at certain wavelengths. The number of optical fibers within the bundle may be varied to match the detector acceptance area and the best "fuzzy" focus height. The optical fiber core material and cladding may be chosen to give the best transmission in the spectral region of interest while providing no limit to the detector etendue.

We claim:

1. In an optical emission monitoring system having a light detector, an improved light collection system for sensing emissions from an extended anisotropic light source comprising:
   (a) an anamorphic lens positioned so that light from said light source impinges upon said lens, and having one of its focal lengths selected to have an f/number equal to or smaller than said detector thereby providing an approximate fuzzy line image which can be transmitted efficiently to the aperture of said detector;
   (b) a fiberoptic bundle for transmitting light from said lens to said detector;
   (c) said fiberoptic bundle characterized by having
      (i) a diameter not greater than the width of said fuzzy line;
      (ii) a numerical aperture greater than that of said detector; and
      (iii) positioned to overfill the limiting area of the etendue of said detector.

2. A device according to claim 1 wherein said fiberoptic bundle is characterized by having;
   (a) a diameter not greater than the width of said fuzzy line;
   (b) a numerical aperture as large as possible with available materials, 3. A device according to claim 1 wherein said optical monitoring system includes two light detectors and wherein said fiberoptic bundle is bifurcated.

4. A device according to claim 1 wherein said optical monitoring system includes two light detectors set to detect light at different wavelengths, and wherein said bifurcated fiberoptic bundle is divided so that a portion of the fibers within said bundle are directed to one of said light detectors and the remainder of said fibers are directed to the other of said light detectors.

5. A device according to claim 4, wherein individual fibers from both portions of said bundle are interleaved so that the light directed to each of said detectors is collected from substantially the same area of the light source.

* * * * *